United States Patent
Keten

(10) Patent No.: US 11,320,791 B2
(45) Date of Patent: May 3, 2022

(54) QUANTUM NV-DIAMOND ATOMIC CLOCK

(71) Applicant: TURK TELEKOMUNIKASYON ANONIM SIRKETI, Istanbul (TR)

(72) Inventor: Umut Keten, Ankara (TR)

( * ) Notice: Subject to any disclaimer, the term of this patent is extended or adjusted under 35 U.S.C. 154(b) by 0 days.

(21) Appl. No.: 16/477,450

(22) PCT Filed: May 15, 2018

(86) PCT No.: PCT/TR2018/050234
§ 371 (c)(1),
(2) Date: Jul. 11, 2019

(87) PCT Pub. No.: WO2019/212430
PCT Pub. Date: Nov. 7, 2019

(65) Prior Publication Data
US 2021/0333761 A1    Oct. 28, 2021

(30) Foreign Application Priority Data

Apr. 30, 2018 (TR) .................................. 2018/06136

(51) Int. Cl.
  *H03L 7/26*     (2006.01)
  *G04F 5/14*     (2006.01)
  *G01R 33/36*    (2006.01)
  *G02B 21/00*    (2006.01)

(52) U.S. Cl.
  CPC ............... *G04F 5/14* (2013.01); *G01R 33/36* (2013.01); *G02B 21/0016* (2013.01)

(58) Field of Classification Search
  CPC ......... G04F 5/14; G01R 33/36; G01R 33/032; G01R 33/323; G01R 33/44; G02B 21/0016

USPC ....................................................... 331/3, 94.1
See application file for complete search history.

(56) References Cited

U.S. PATENT DOCUMENTS

| 2010/0321117 | A1* | 12/2010 | Gan .......................... H03L 7/26 331/3 |
| 2015/0001422 | A1  | 1/2015  | Englund et al. |
| 2015/0358026 | A1* | 12/2015 | Gan .......................... H03L 7/26 331/94.1 |

FOREIGN PATENT DOCUMENTS

| CN | 105352489 A   | 2/2016 |
| WO | 2012034924 A1 | 3/2012 |

OTHER PUBLICATIONS

International Search Report for corresponding PCT/TR2018/050234.
Steinert S., et al., "High sensitivity magnetic imaging using an array of spins in diamond", Review of Scientific Instruments, AIP, Apr. 23, 2010.
Gao, W.B. et al., "Coherent manipulation, measurement and entanglement of individual solid-state spins using optical fields", Nature Photonics, UK, May 28, 2015, pp. 363-373, vol. 9, No. 6.

* cited by examiner

*Primary Examiner* — Richard Tan
(74) *Attorney, Agent, or Firm* — Egbert, McDaniel & Swartz, PLLC

(57) ABSTRACT

The invention is related to a novel atomic clock developed by taking into basis Quantum mechanics and the spin-spin status of the electrodes that have been trapped. The disadvantages such as radioactivity perceived in atomic clocks, half life and shelf life are prevented by means of the invention.

7 Claims, 2 Drawing Sheets

QUANTUM NV-DIAMOND ATOMIC CLOCK

TECHNICAL FIELD

The invention is related to atomic clocks used for precise time measurement.

The invention is particularly related to a novel atomic clock developed by taking into basis Quantum mechanics and the spin-spin status of the electrodes that have been trapped.

PRIOR ART

Nowadays different types of atomic clocks that are used normally and commonly are present. All of the operation principles of the atomic clocks used in the prior art are the same. The basic difference between different atomic clocks is sourced from the differences of the tools used to determine the difference in the elements used and the energy levels.

Some of the various atomic clocks used in the prior art are atomic clocks such as cesium atomic clocks, hydrogen atomic clocks, rubidium atomic clocks. Nowadays, cesium atomic clocks which are more commonly used, operate by using a cesium atomic bundle. The clock differentiates cesium atoms that have different energy levels by means of a magnetic field. Hydrogen atom clocks, keep the hydrogen atoms at the required energy level inside a container, whose walls are made of special material and thereby the hydrogen atoms do not lose their energy levels in a short period of time.

The most compact and simple atomic clocks within the prior art are rubidium atomic clocks. Rubidium atomic clocks having a cell utilize rubidium gas which changes light absorption in optical rubidium frequency when the microwave frequency around it is exactly straight. Nowadays the most precise atomic clocks of the prior art use, cesium atoms, detectors and normal magnetic fields. Additionally the back and forth whizzing of the cesium atoms are stopped by means of laser bundles and this reduces the minor changes sourced from Doppler effects in the frequency. All of the atomic clocks that are already being used have a shelf life of approximately 10 years and their primary disadvantages are that they are radioactive and have half life.

As a result the above mentioned problems that have not been solved in the prior art has made it a necessity to provide a novelty in the related technical field.

BRIEF DESCRIPTION OF THE INVENTION

The present invention is related to a quantum nv-diamond atomic clock that has been developed in order to provide new advantages to the related technical field and to eliminate the above mentioned disadvantages.

The main aim of the invention is to develop an atomic clock which eliminates disadvantages such as radioactivity perceived in atomic clocks, half life and shelf life that can be observed in the atomic clocks of the prior art.

Another aim of the invention is to provide an atomic clock which enables higher precision time measurement in comparison to the atomic clocks used in the prior art.

Another aim of the invention is to obtain an atomic clock having a determination mechanism which does not necessitate the conversion of resonance into radio waves in order to energize the atoms so that piezoelectricity effect can be regulated.

Another aim of the invention is to provide an atomic clock which enables to realize the optical measurement of the pulses created by a trapped electron.

The present invention which has been mentioned above and which can reach all the aims that can be construed from the detailed description below is a quantum nv-diamond atomic clock which can eliminate the disadvantages such as half life, short shelf life and radioactivity that can be observed in the present atomic clocks. Accordingly the present invention comprises,

- at least a microwave energy source that is used to deliver the electrode nitrogen atom to a covalent bond,
- at least a diamond crystal having a nitrogen vacancy centre defect,
- at least an MRI unit which provides magnetic resonance imaging, optical microscopy, optical determination and resonance determination,
- at least an inner housing which blocks electromagnetic waves,
- at least an outer housing which blocks electromagnetic waves,
- at least an output unit which calculates the pulses obtained from determination mechanisms,
- at least an antenna which takes the initial time value and/or back up function.

The invention needs to be evaluated together with the figures that have been illustrated in order to further describe the advantages together with the embodiments and additional elements of the invention.

REFERENCE NUMBERS

Figure 1:
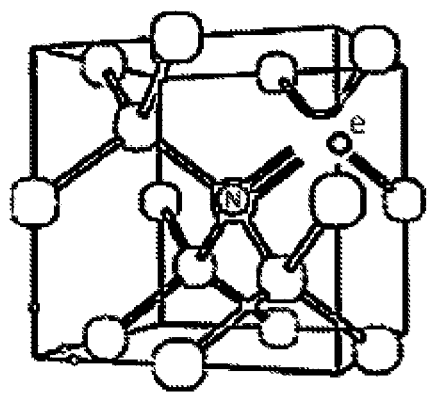
FIG. 1, shows the schematic view of the N-V centered diamond.

1. Microwave energy source
2. NV-centered diamond
3. MRI unit
4. Alternative unit
5. Inner housing
6. Outer housing
7. Output unit
8. Antenna

DETAILED DESCRIPTION OF THE INVENTION

Figure 5:
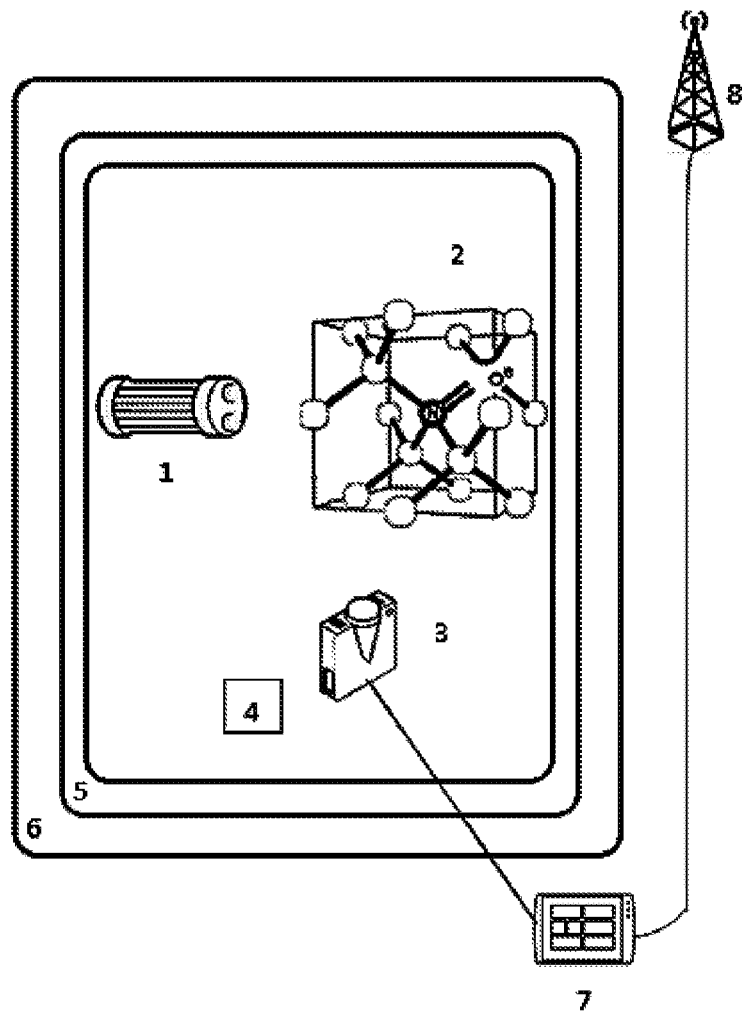
FIG. 5, shows the proposed device scheme of the Quantum NV-Diamond atom clock.

In this detailed description the novelty brought about by the invention has been further described with embodiments that do not limit the invention in any way. In FIG. 5, the quantum nv-diamond atom clock scheme that is proposed has been given. Accordingly the invention comprises, at least a microwave energy source (1) that is used to deliver the electrode nitrogen atom to a covalent bond, at least a NV-centered diamond (2) having a nitrogen vacancy centre defect, at least an MRI unit (3) which provides magnetic resonance imaging, optical microscopy, optical determination and resonance determination, at least an inner housing (5) which blocks electromagnetic waves, at least an outer housing (6) which blocks electromagnetic waves, at least an output unit (7) which calculates the pulses obtained from determination mechanisms, at least an antenna (8) which takes the initial time value and/or back up function.

An alternative unit (4) can be used as an alternative to the MRI unit (3) that has been described in the different embodiments of the invention. Said alternative unit (4) can be characterized as, an optical microscope, optical determination units or other resonance type units.

Figure 2:
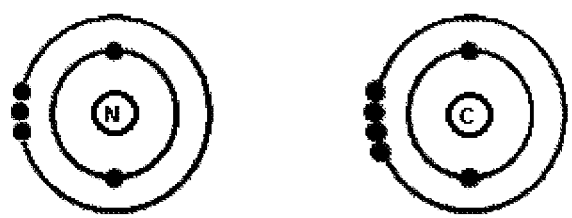
FIG. 2, shows the schematic view of the nitrogen and carbon atom.
Figure 3:
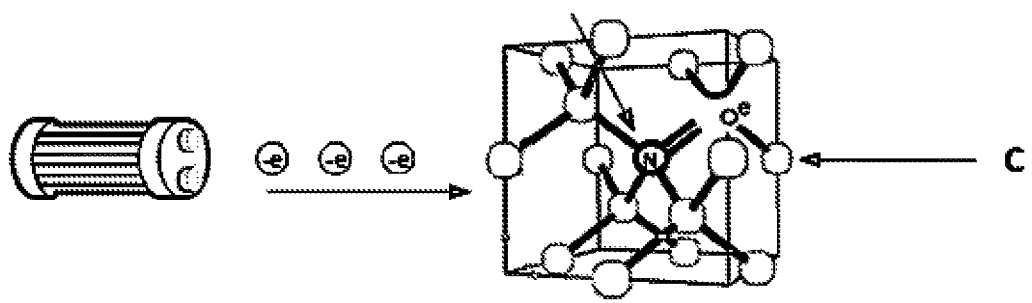
FIG. 3, shows the electrons received from the energy source and the schematic view of the convection.
Figure 4:
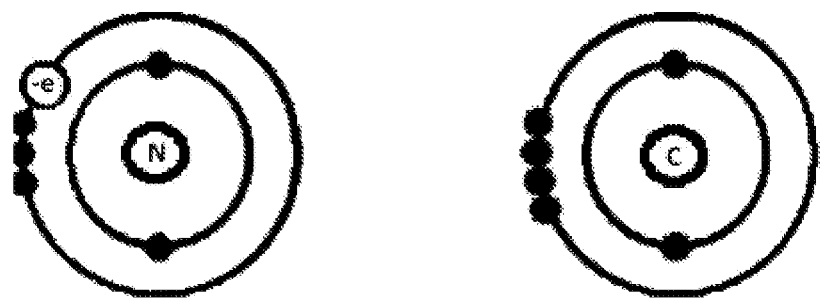
FIG. 4, shows the schematic view of the electrode which has tagged along to the nitrogen atom orbit.

The output unit (7) mentioned in the preferred embodiment of the invention receives the oscillation count from the MRI unit (3) as Hz. The unit should be able to determine oscillations and count them up to at least from 32768 pulses per second to 9192631770 pulses per second depending on the type of diamond or quartz. When there is a deviation (below the minimum oscillation count), the output unit (7) connected to the microwave energy source (1) triggers a new microwave pulse in order to continue linearity The operation principal of the invention is as follows: NV is a defect where a nitrogen atom replaces one of the carbon atoms inside the lattice of diamond crystal. NV defects are formed by placing nitrogen via either nitrogen via natural growth or afterwards via annealing into high purity diamond. In FIG. 1, an NV-centered diamond (2) is shown schematically. As it can be seen in FIG. 2, the nitrogen atom, does not have four covalent bonds which the carbon atom has. Following the convection received from electrons via the microwave energy source (1) shown in FIG. 3, an electron will tag along the orbit of the nitrogen atom (FIG. 4). The electron (ion) has several features such as being fluorescent. The feature that is required for an atom clock is a phonon standing wave. The oscillation (phonon standing wave) sourced from the nature of the NV centre defect trapped with an ion (electron) can be used as a timer mechanism. The mechanisms that have been described are nuclear spin and dipole coupling, where the spins can be singularly determined by means of a super resolution optical microscope or a magnetic resonance imaging MRI unit (3). Due to the axial symmetry of the NV centre, the two mS=±1 state is degenerated and the mS=0 state has lower energy. The energy difference between the spin low levels are D=2.87 GHz for the basic state and D=1.42 GHz for the exitation state, wherein D, is the quantity known as the zero field dissociation. This magnetic field dependency forms the basis of all magnetic detection applications. Optical transitions are processes that strongly protect spinning and this means that during a cycle the spin state does not change. Photons are oscillations in a lattice. The Photons create a wave along a lattice. A nitrogen vacancy and electron will simply oscillate and fluorescent emissions will be created. The electron does not comply with the conventional atomic orbit limits, however it is subject to intermittent orbits. It is coupled strongly to carbon and it still is being pulled to nitrogen. Fluorescence and oscillations can be measured/determined. The spin Hamiltonian of the NV centre is as follows:

$$\frac{\mathcal{H}}{\hbar} = \underbrace{D\left(S_z^2 - \frac{2}{3}\right)}_{zfs} + \underbrace{\gamma B \cdot S}_{magnetic} +$$ (Formula 1)

-continued $$\underbrace{\epsilon_z E_z\left(S_z^2 - \frac{2}{3}\right) + \epsilon_{xy}\{E_x(S_x S_y + S_y S_x) + E_y(S_x^2 + S_y^2)\}}_{electric}.$$

Wherein D=2.87 GHz is zero field separation (zfs). B is a vector magnetic field, E={Ex,Ey,Ez} is a vector electrical field and _z and _xy are coupling constants. The main axis of the NV centre according to the convention is along the −z axis or crystal axis.

As it has been described above before, due to the fluorescence emission characteristics of the NV centre defect, the MRI unit (3) can use optical detection mechanisms instead of determination mechanisms;

The stable state of the fluorescence emission and the separable spin states of each NV centre are the same. In comparison to an overlapping state without correlation, one of the states shall probably have two photon emissions. Stable state fluorescence emission;

$$\Psi^+ = \frac{1}{\sqrt{2}}(|01\rangle + i|10\rangle), \Phi^+ = \frac{1}{\sqrt{2}}(|00\rangle + i|11\rangle)$$ (Formula 2)

The Φ state needs to have two photon emissions that is higher in comparison to an overlapping state, whereas Ψ gives a lower probability result.

The invention claimed is:

1. A quantum diamond clock comprising:
   at least one microwave energy source adapted to deliver an electrode nitrogen atom to a covalent bond;
   at least one nitrogen vacancy centered diamond having a nitrogen vacancy center defect;
   at least one magnetic resonance imaging unit adapted to perform a magnetic resonance imaging and an optical microscopy and an optical determination and a resonance determination;
   at least one inner housing adapted to block electromagnetic waves;
   at least one outer housing adapted to block electromagnetic waves;
   at least one output unit that calculates pulses obtained from said at least one magnetic resonance imaging unit; and
   at least one antenna that takes an initial time value or a back-up function.

2. The quantum diamond clock of claim 1, further comprising:
   at least one alternative unit cooperative with said at least one magnetic resonance imaging unit.

3. The quantum diamond clock of claim 2, wherein said at least one alternative unit is an optical microscopy unit.

4. The quantum diamond clock of claim 2, wherein said at least one alternative unit is an optical determination unit.

5. The quantum diamond clock of claim 2, wherein said at least one alternative unit is a resonance determination unit.

6. The quantum diamond clock of claim 1, wherein said at least one antenna is a Global Navigation Satellite System (GNSS) antenna.

7. The quantum diamond clock of claim 1, wherein said at least one antenna is a Global Positioning System (GPS) antenna.

* * * * *